United States Patent [19]

Schwartz et al.

[11] Patent Number: 4,862,404
[45] Date of Patent: Aug. 29, 1989

[54] DIGITAL CIRCUIT FOR SUPPRESSING FAST SIGNAL VARIATIONS

[75] Inventors: Wolfgang Schwartz; Otto L. Warmuth; Claus D. Grzyb, all of Hamburg, Fed. Rep. of Germany

[73] Assignee: U.S. Philips Corporation, New York, N.Y.

[21] Appl. No.: 71,695

[22] Filed: Jul. 9, 1987

[30] Foreign Application Priority Data

Jul. 11, 1986 [DE] Fed. Rep. of Germany ....... 3623301

[51] Int. Cl.[4] .......................... G06F 15/31; H04N 5/44
[52] U.S. Cl. .................................. 364/733; 358/194.1; 455/603
[58] Field of Search ..................... 358/194.1; 364/724, 364/724.01, 733; 375/104; 455/352, 353, 603, 151

[56] References Cited

U.S. PATENT DOCUMENTS

| | | | |
|---|---|---|---|
| 4,156,134 | 5/1979 | Minner | 455/603 |
| 4,231,031 | 10/1980 | Crowther et al. | 455/353 |
| 4,245,347 | 1/1982 | Hutton et al. | 455/352 |
| 4,352,202 | 9/1982 | Carney | 455/352 |
| 4,517,564 | 5/1985 | Mosishita et al. | 358/194.1 |
| 4,573,135 | 2/1986 | Dieterich | 364/724 |
| 4,630,290 | 12/1986 | Kage | 375/104 |
| 4,697,098 | 9/1987 | Cloke | 375/104 |

FOREIGN PATENT DOCUMENTS 3340775 5/1985 Fed. Rep. of Germany ... 358/194.1

Primary Examiner—Gary V. Harkcom
Assistant Examiner—Dale M. Shaw
Attorney, Agent, or Firm—Michael E. Marion

[57] ABSTRACT

A digital circuit which receives a serial input signal and which suppresses fast signal variations. The digital circuit includes an integrator circuit (1) which generates a multi-bit signal by integration of the serial input signal. The output signal of the integrator circuit is applied to an evaluation circuit (2) which generates a serial output signal which assumes a first state when the multi-bit signal exceeds a first threshold value and a second state when the multi-bit signal is below a second threshold value.

9 Claims, 1 Drawing Sheet

DIGITAL CIRCUIT FOR SUPPRESSING FAST SIGNAL VARIATIONS

BACKGROUND OF THE INVENTION

The invention relates to a digital circuit which receives a serial input signal and which suppresses fast signal variations.

Electronic consumer products, for example television receivers, are often controlled by means of a remote control device. Such remote control devices comprise a transmitter whose signals are received by a receiver in order to be applied to a microprocessor which executes the operation desired by the operator.

In the case of television receivers, infrared light is frequently used for transmitting such signals. The infrared receiver receives serial signals from the infrared transmitter which are applied to the microprocessor via a controllable amplifier. During prolonged transmission intervals, i.e. when no signal is transmitted by the infrared transmitter, the amplifier is controlled so that the gain is maximum. Consequently, spurious light received by the infrared light receiver can reach the microprocessor via the amplifier.

The serial signal has two states which are customarily referred to as "1" and "0", or "high" and "low". The spurious light causes fast variations in the serial signal, i.e. the serial signal assumes a state only very briefly, for example the state "1". The frequency at which the states of the serial signal change is much higher in the case of spurious light than in the case of a transmission signal.

The microprocessor evaluates the transmission signal. The appearance of such a disturbance briefly interrupts the execution of the normal program. When such interruptions due to the higher-frequency disturbances occur more often, the normal program of the microprocessor will be disturbed. From Japanese Kokai 52-129.271 a filter circuit is known which suppresses the described disturbances. In addition to several logic circuits and comparators, the filter circuit comprises a count-up/count-down counter.

SUMMARY OF THE INVENTION

It is the object of the invention to construct a digital circuit of the kind set forth so that the disturbances in the serial output signal of the digital circuit are suppressed to a high degree by means of a filter circuit which is less complex than the cited state of the art.

This object is achieved in accordance with the invention in that an integrator circuit generates a multi-bit signal by integration of the serial input signal, an evaluation circuit deriving from the multi-bit signal a serial input signal which assumes a first state when the multi-bit signal exceeds a first threshold value and a second state when the multi-bit signal is below a second threshold, value.

In the digital circuit in accordance with the invention, as a result of the integration of the serial input signal the output signal of the integrator circuit is delta-shaped. It is only when the output signal of the evaluation circuit exceeds a given threshold value or fails to exceed this threshold value that the evaluation circuit detects a signal transition in the serial input signal, i.e. that no disturbance has occurred. In its simplest form such an integrator circuit consists of an adder which adds the input signal and the integrator output signal which has been delayed in a register. The integrator circuit should be constructed so that a given value (the threshold value) is reached only when the duration of a signal state exceeds a given value. Thus, a signal transition must be recognized when the frequency at which the states of the signal change is lower than the frequency in the case of disturbances.

The digital circuit exhibits a low-pass behavior as regards the serial input signals, because a state transition occurs only at low frequencies.

An embodiment of the integrator circuit comprises a first circuit section in which the output signals of two series-connected delay elements which introduce a delay of one clock pulse period and the first of which receives the serial input signal form a two-bit output signal, and a second circuit section which comprises a first adder whose first input receives the two-bit output signal and whose second input receives the output signal of a second adder, and also comprises a divider circuit which has a division ratio of 32 and which receives the multi-bit output signal of a delay element which constitutes the output signal of the integrator circuit, said delay element storing and delaying by two clock pulse periods the output signal of the first adder after every second clock pulse period, its output signal being subtracted from the multi-bit output signal in the second adder. Such a circuit in fact functions as a recursive filter.

The two delay elements of the first circuit section may be, for example D-flip-flops. When the output signal of the first D-flipflop forms the most-significant bit, the first circuit section can also be realized by means of an adder whose first input receives the serial input signal and whose second input receives the output signal of a divider having a division ratio of 2. The divider then receives the serial input signal which has been delayed by one clock pulse period. The second circuit section has the described simple integrator structure and a further branch which includes a divider having a division ratio of 32. The integrator circuit generates a 7-bit signal which can reach the maximum decimal value 96 and the minimum decimal value 31 when the 7-bit signal is considered as a dual number. Therefore, the threshold values in the evaluation circuit must be chosen so as to be situated between the values 96 and 31.

An embodiment of the evaluation circuit comprises a logic circuit which combines the three most-significant bits of the multi-bit signal and which sets a flipflop which generates the serial output signal when the multi-bit signal exceeds the first threshold value, and which resets the flipflop when the multi-bit signal is below the second threshold value.

The logic circuit comprises a NOR-gate, one input of which receives the most-significant bit, its other input being connected to the output of a first AND-gate which receives the other bits, its output being connected to the set input of the flipflop, and also comprises a second AND-gate, one input of which receives the most-significant bit, its other input being connected to the output of an OR-gate which receives the other bits, its output being connected to the reset input of the flipflop.

The logic circuit is designed so that the first threshold value corresponds to the value 80 and the second threshold value to the value 48.

As has already been stated, the digital circuit can be used in an infrared receiving device. The infrared light signal converted into an electric signal by a receiving circuit is then applied, via a controllable amplifier, to the digital circuit whose output signal is applied, for example to a microprocessor.

BRIEF DESCRIPTION OF THE DRAWINGS

An embodiment in accordance with the invention will be described in detail hereinafter with reference to the accompanying diagrammatic drawings Therein.

DETAILED DESCRIPTION OF THE INVENTION

Figure 1:
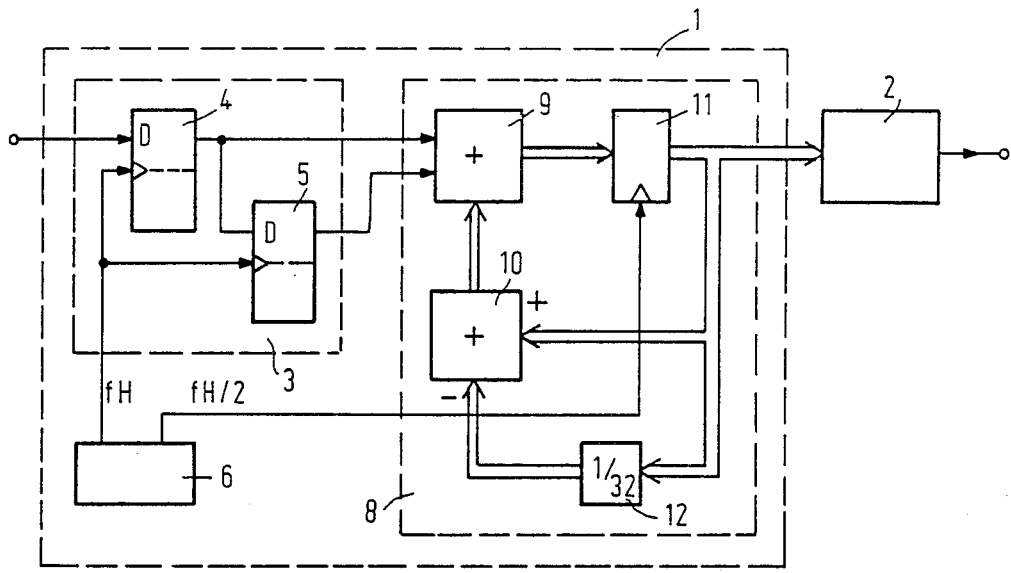
FIG. 1 shows the digital circuit in accordance with the invention.

In FIG. 1 the serial input signal is applied to an integrator circuit 1 which generates a 7-bit output signal which is applied to an evaluation circuit 2 which outputs a serial output signal. The serial input signal has two states which are referred to hereinafter as "1" and "0". In the digital circuit, consisting of the integrator circuit 1 and the evaluation circuit 2, a serial output signal is generated which does not have a state of short duration. Brief signal states, i.e. signals with fast signal variations, are suppressed by the digital circuit and will not be present in the serial output signal. In the case of disturbances, the frequency at which the states of the signal change is higher than in the case of a non-disturbed signal.

The integrator circuit 1 comprises a first circuit section 3 which comprises two D-flipflops 4 and 5. The D-input of the D-flipflop 4 receives the serial input signal and its clock input receives a clock signal having a clock frequency fH from a clock signal generator 6. In response to each effective edge of the clock signal, the respective signal state of the serial input signal is stored, i.e. a "1" or "0", and made available on the output of the D-flipflop 4. The serial output signal of the D-flipflop 4 is applied to the D-input of the D-flipflop 5. The D-flipflop 5 also receives the clock signal (frequency fH) from the clock signal generator 6. The output signals of the D-flipflop 4 and the D-flipflop 5 form the two-bit input signal for a second circuit section 8 of the integrator circuit 1. The most-significant bit is the output signal of the D-flipflop 4.

The two-bit input signal for the second circuit section 8 is applied to an adder 9, the other input of which receives a 7-bit signal from a further adder 10. The 7-bit output signal of the adder 9 is applied to a register 11 which receives a further clock signal from the clock signal generator 6, the frequency fh/2 of said further clock signal amounting to half the frequency of the clock signal applied to the two D-flipflops 4 and 5. Thus, the register 11 stores the output signal of the adder 9 only every second clock pulse period and also delays this signal by two clock pulse periods. The output signal of the register 11 forms the output signal of the integrator circuit 1. It is also applied to the first input of the adder 10 and to a divider circuit 12 having a division ratio of 32. The output signal of the divider circuit 12 is applied to the second input of the adder 10. Such a divider circuit is realized in practice by performing a positional shift over five binary positions. Using the adder 10, the output signal of the divider circuit 12 is subtracted from the multi-bit output signal of the register 11. In the adder 10 the two's complement of the output signal of the divider circuit is formed, after which addition to the multi-bit output signal takes place.

When the multi-bit signal is interpreted as a binary number, the maximum value of the multi-bit output signal amounts to decimal 96 and the minimum value of the output signal to decimal 31. The longer the duration of the state of a serial input signal, the closer the output signal of the integrator circuit 1 will approach the value 96 or 31. The variation of the output signal is, therefore, delta-shaped. In the case of very fast variations of the serial input signal, the value of the output signal of the integrator circuit will remain remote from the limit values.

Figure 2:
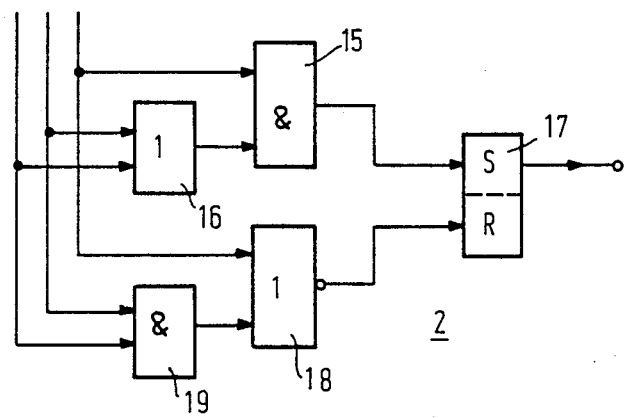
FIG. 2 shows a detailed embodiment of the evaluation circuit.

In the evaluation circuit 2 it is determined whether a change of state of the serial input signal has been caused by a disturbance or whether a non-disturbed signal is concerned. FIG. 2 shows an embodiment of the evaluation circuit 2. The three most-significant bits of the 7-bit output signal of the integrator circuit 1 are applied to the evaluation circuit 2. The most-significant bit is applied to the first input of an AND-gate 15, whose other input receives the other bits which have been combined in an OR-gate 16. The output of the AND-gate 15 is connected to a set input of flipflop 17. The output signal of the flipflop 17 forms the serial output signal of the evaluation circuit 2. The reset input of the flipflop 17 is connected to the output of a NOR-gate 18, one input of which receives the most-significant bit, its other input receiving the output signal of an OR-gate 19 which combines the other two bits.

The logic circuit of the evaluation circuit 2, formed by the gates 15, 16, 18 and 19, determines whether the output signal of the integrator circuit 1 exceeds the value 80, in which case the flipflop 17 is set, and whether the output signal has dropped below the value 48, in which case the flipflop 17 is reset. The first threshold value of the evaluation circuit is, therefore, 80 and the second threshold value is 48. Practical tests have demonstrated that these threshold values lead to reliable suppression of disturbances.

A digital circuit of this kind can be used for suppressing disturbances in an infrared light-receiving device. The infrared light received is converted into an electric signal in a receiving circuit in order to be applied to a controllable amplifier. The output signal of the controllable amplifier is applied to the digital circuit which suppresses disturbances and whose serial output signal is applied, for example to a microprocessor. When the microprocessor operates at a clock frequency of, for example 2 MHz (which is also the clock frequency of the clock signal applied to the D-flipflops), the digital circuit will suppress all signal variations below 20 KHz.

We claim:

1. A digital circuit which receives a serial input signal and which suppresses fast signal variations in said signal, said digital circuit comprising an integrator circuit which generates a multi-bit signal by integration of said serial input signal, and an evaluation circuit which derives from said multi-bit signal a serial output signal which assumes a first state when said multi-bit signal exceeds a first threshold value and a second state when said multi-bit signal is below a second threshold value, said evaluation circuit comprising logic means for combining the three most significant bits of said multi-bit signal into a control signal when said multi-bit signal exceeds said first threshold value which sets a flipflop so as to generate said serial output signal, and resets said flipflop when said multi-bit signal is below said second threshold value.

2. A digital circuit as claimed in claim 1, wherein said integrator circuit comprises a first circuit section in which the output signals of two series connected delay elements form a two-bit output signal, and a second circuit section which comprises a first adder whose first input receives the two-bit output signal and whose second input receives the output signal of a second adder, and also comprises a divider circuit which has a division ratio of 32 and which receives the multi-bit output signal of a delay element which constitutes the output signal of said integration means, said delay element storing and delaying by two clock pulse periods the output signal of the first adder after every second clock pulse period, its output signal being subtracted from the multi-bit output signal in the second adder.

3. The use of a digital circuit as claimed in claim 2 in an infrared receiving device.

4. A digital circuit as claimed claim 1, wherein said logic means comprises a NOR-gate, one input of which receives the most-significant bit, its other input being coupled to the output of a first AND-gate which receives the other bits, its output being coupled to the set input of the flipflop, and a second AND-gate, one input of which receives the most-significant bit, its other input being coupled to the output of an OR-gate which receives the other bits, its output being coupled to the reset input of the flipflop.

5. The use of a digital circuit as claimed in claim 4 in an infrared receiving device.

6. The use of a digital circuit as claimed in claim 1 in an infrared receiving device.

7. The use of a digital circuit as claimed in claim 1 in an infrared receiving device.

8. A digital circuit for producing an output signal, said circuit having as an input a serial input signal having a plurality of states, said digital circuit comprising:
(a) means for integrating said serial input signal so as to generate a multi-bit signal, said multi-bit signal having a value representing variation in said states of said input signal.
(b) means for evaluating said multi-bit signal and for deriving therefrom an output signal which assumes a first state when said multi-bit signal exceeds a first threshold value, and a second state when said multi-bit signal is below a second threshold value, said evaluating means comprising logic means for combining the three most significant bits of said multi-bit signal and for generating a control signal which sets a flipflop coupled thereto when said multi-bit signal exceeds said first threshold value thereby generating said serial output signal, and resets said flipflop when said multi-bit signal is below said second threshold value.

9. The use of a digital circuit as claimed in claim 8 in an infrared receiving device.

* * * * *